United States Patent
Akaike et al.

(10) Patent No.: US 8,653,860 B2
(45) Date of Patent: Feb. 18, 2014

(54) FREQUENCY SYNTHESIZER

(75) Inventors: Kazuo Akaike, Sayama (JP); Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/473,684

(22) Filed: May 17, 2012

(65) Prior Publication Data

US 2012/0293213 A1    Nov. 22, 2012

(30) Foreign Application Priority Data

May 20, 2011    (JP) .................... 2011-114012

(51) Int. Cl.
    *H03B 21/00*    (2006.01)
(52) U.S. Cl.
    USPC .......................................... 327/107; 327/105
(58) Field of Classification Search
    USPC ................... 327/105, 107, 147, 156
    See application file for complete search history.

(56) References Cited

U.S. PATENT DOCUMENTS 6,888,413 B1 *    5/2005    Adams et al. ............ 331/17
7,825,701 B2 *    11/2010   Kobata et al. .......... 327/105

FOREIGN PATENT DOCUMENTS

JP    2007-074291    3/2007

* cited by examiner

*Primary Examiner* — Hai L Nguyen
(74) *Attorney, Agent, or Firm* — Jordan and Hamburg LLP (57) ABSTRACT

In forming a frequency synthesizer by using PLL using processing of digital signals, an A/D converting unit is not required. By the integration of a digital value that depends on a set frequency, a saw-tooth wave serving as a phase signal is generated. A frequency signal output from a voltage-controlled oscillator is input via a frequency divider to an edge detecting unit, which then detects a rising edge or a falling edge of the frequency signal to generate a rectangular-wave signal that depends on a frequency of the frequency signal. Then, a latched circuit latches a value of the saw-tooth wave in response to the rectangular-wave signal, and this value is integrated in a loop filter and the resultant is used as a control voltage of the voltage-controlled oscillator.

3 Claims, 7 Drawing Sheets

| CLOCK NUMBER | INPUT VALUE | OUTPUT VALUE | DECIMAL VALUE |
|---|---|---|---|
| 0 | 1 | 0000 | 0 |
| 1 | 1 | 0001 | 1 |
| 2 | 1 | 0010 | 2 |
| 3 | 1 | 0011 | 3 |
| 4 | 1 | 0100 | 4 |
| 5 | 1 | 0101 | 5 |
| 6 | 1 | 0110 | 6 |
| 7 | 1 | 0111 | 7 |
| 8 | 1 | 1000 | -8 |
| 9 | 1 | 1001 | -7 |
| 10 | 1 | 1010 | -6 |
| 11 | 1 | 1011 | -5 |
| 12 | 1 | 1100 | -4 |
| 13 | 1 | 1101 | -3 |
| 14 | 1 | 1110 | -2 |
| 15 | 1 | 1111 | -1 |
| 16 | 1 | 0000 | 0 |
| 17 | 1 | 0001 | 1 |
| 18 | 1 | 0010 | 2 |

FREQUENCY SYNTHESIZER

BACKGROUND OF THE INVENTION

1. Field of the Invention

The present invention relates to a frequency synthesizer including PLL using processing of digital signals.

2. Description of the Related Art

As one of standard signal generators, a frequency synthesizer using PLL (Phase Locked Loop) is known, and its application includes, for instance, a local oscillating unit in a mobile terminal, a test signal source of a radio communication equipment, a broadcast equipment, and so on. When applied in a communication field, a frequency synthesizer is required to generate little noise in order to avoid interference with other channels and is desirably capable of setting a frequency as finely as possible under the circumstances where radio waves are overcrowded.

Therefore, the present applicant developed a frequency synthesizer satisfying these requirements yet having a simple circuit structure and this art has already been disclosed in Patent Document 1 and so on. For example, in a method of Patent Document 1, an output signal of a voltage-controlled oscillator is A/D (analog/digital) converted to generate a rotating vector corresponding to the output signal, and a rotating vector for phase comparison with the aforesaid rotating vector is generated. A phase comparison result is D/A converted after passing through a loop filter, and an obtained analog signal is input as a control voltage to the voltage-controlled oscillator.

Such a device, however, has a problem that its circuit is complicated since, after the A/D (analog/digital) conversion, the resulting digital signal is processed to be D/A converted. Moreover, in order to generate the rotating vector for the phase comparison, a table for storing digital data on a complex plane is necessary.

[Patent Document 1] Japanese Patent Application Laid-open No. 2007-74291

SUMMARY OF THE INVENTION

The present invention was made under such circumstances, and has an object to provide a frequency synthesizer using PLL and having a simple structure.

A frequency synthesizer of the present invention is including:

a voltage-controlled oscillator;

a frequency divider which divides a frequency signal output from the voltage controlled oscillator;

an integrated waveform generating unit receiving a digital signal having a digital value that depends on a set frequency and integrating the digital value to generate a saw-tooth wave having a saw-tooth shaped integrated waveform in which a negative value and a positive value are combined;

an edge detecting unit detecting a rising edge or a falling edge of a frequency signal output from the frequency divider to output a rectangular wave signal that depends on a frequency of the frequency signal;

a latched circuit latching a value of the saw-tooth wave generated by the integrated waveform generating unit, in response to the rectangular wave signal;

a loop filter integrating the value of the saw-tooth wave latched by the latched circuit; and a digital/analog converting unit digital/analog-converting an output of the loop filter to output a resultant to the voltage-controlled oscillator.

The digital value to be integrated in the integrated waveform generating circuit is twos complement, for instance.

A possible preferable embodiment is a structure including a moving average processing circuit performing moving average processing of the value of the saw-tooth wave output from the latched circuit to output a resultant to the loop filter.

According to the present invention, in the frequency synthesizer including the PLL using the processing of digital signals, the value of the saw-tooth wave being a phase signal generated from the digital signal is latched in response to the rectangular wave signal that depends on the frequency of the frequency signal output from the voltage-controlled oscillator, and the control voltage of the voltage-controlled oscillator is generated based on the latched value. This structure requires neither an A/D converting unit nor a large-capacity data table and accordingly can be simple. Further, since the phase signal (saw-tooth wave) and the rectangular wave signal being a latch timing signal are asynchronous, there is a concern about the occurrence of a spurious component depending on the set frequency, but the moving average processing of the latched value of the saw-tooth wave can prevent the occurrence of the spurious component.

DETAILED DESCRIPTION OF THE PREFERRED EMBODIMENT

Figure 1:
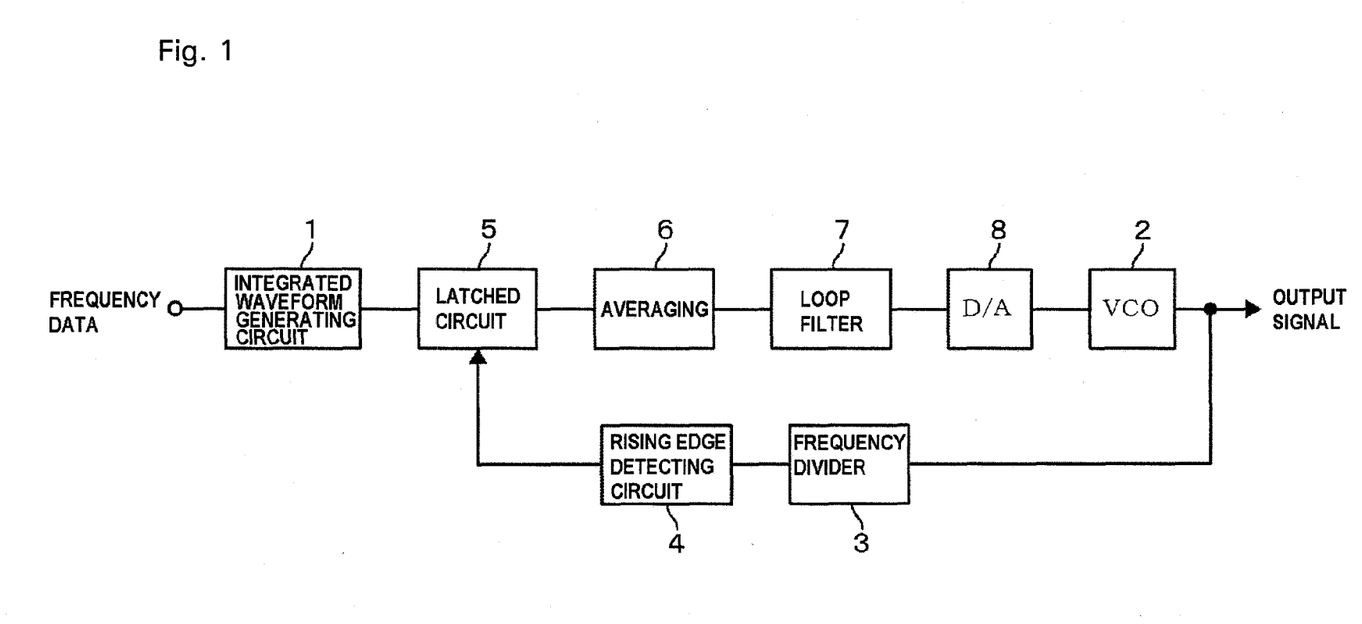
FIG. 1 is a block diagram showing the whole structure of an embodiment of a frequency synthesizer according to the present invention.
Figure 2:
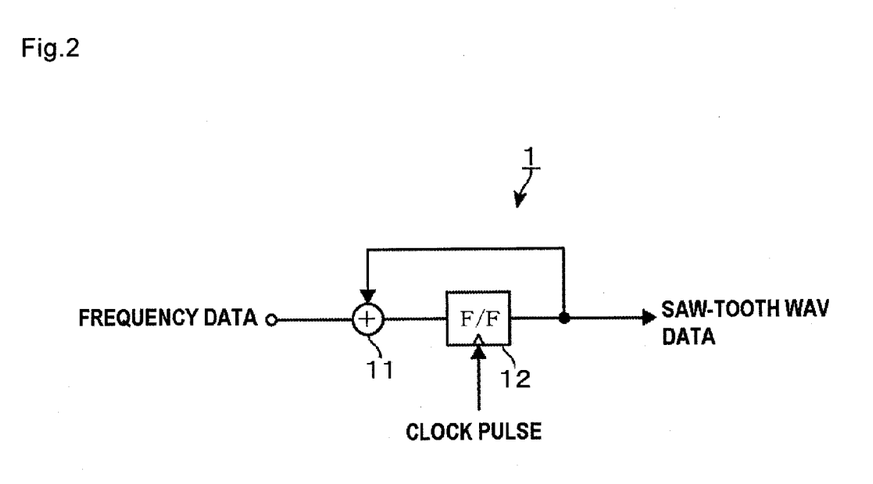
FIG. 2 is a block diagram showing a circuit of an integrated waveform generating unit.

FIG. 1 is a block diagram showing the whole structure of an embodiment of a frequency synthesizer according to the present invention, in which 1 denotes an integrated waveform generating circuit. The integrated waveform generating circuit 1 has a function of outputting, as digital data, a saw-tooth wave (wave having a saw-tooth shaped integrated waveform) with a frequency that depends on a digital value (frequency data) input thereto, and as shown in FIG. 2, the integrated waveform generating circuit 1 has a flip-flop 12 provided on a subsequent stage of an adding unit 11, and the adding unit 11 adds an output of the flip-flop 12 and the input value. The flip-flop 12 receives a clock signal from a not-shown clock generator and at a timing when the clock signal is input, it outputs data input from the adding unit 11. A frequency of the clock signal is, for example, about 20 MHz when, for instance, 5 MHz needs to be obtained as a frequency of the saw-tooth wave specified by a group of the digital values that are output. This saw-tooth wave plays a role of a phase wave on a PLL loop.

Figure 3:
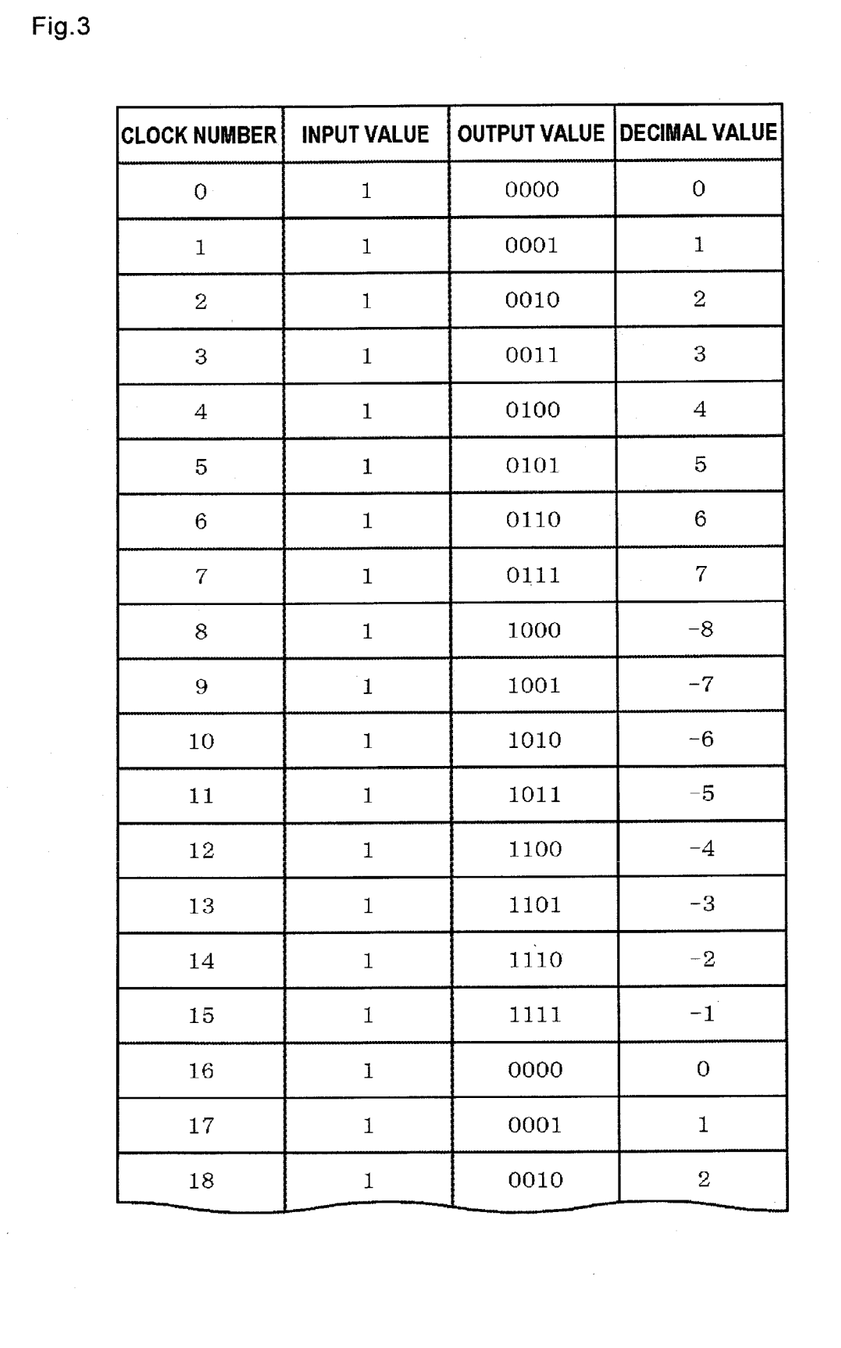
FIG. 3 is an explanatory chart showing the operation of the integrated waveform generating unit.
Figure 4:
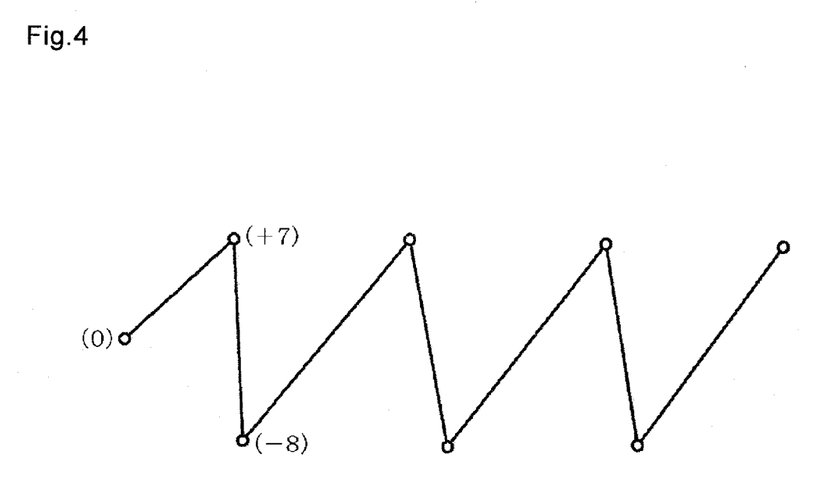
FIG. 4 is a waveform chart showing an output waveform of the integrated waveform generating unit.

The operation of the integrated waveform generating unit 1 will be described with reference to FIG. 3, taking a case where it operates with four-bit digital values as an example for convenience sake. The digital value is handled as a complement of "2", and assuming that an input value being the frequency data input to the integrated waveform generating circuit 1 is, for example, "0001", the input value and the output value of the flip-flop 12 are added, so that an addition value increases. When the addition value becomes "0111" and next "0001" is input, the addition value becomes "1000", so that a decimal value changes to a negative value. Therefore, a relation among a pulse number (this number is assigned for convenience sake) of the clock signal input to the flip-flop 12, the frequency data (input value), and the output value is that shown in FIG. 3, and as shown in FIG. 4, the output waveform becomes a saw-tooth wave having an integrated waveform of the input value. Since the frequency of the saw-tooth wave is determined according to the input value being the set frequency data, this frequency data serves as data determining a set frequency of a signal generator as will be described later. Incidentally, though it is assumed in this description that the digital signal of the integrated waveform generating circuit 1 has four bits, a 32-bit signal is actually used, for instance.

Figure 5:
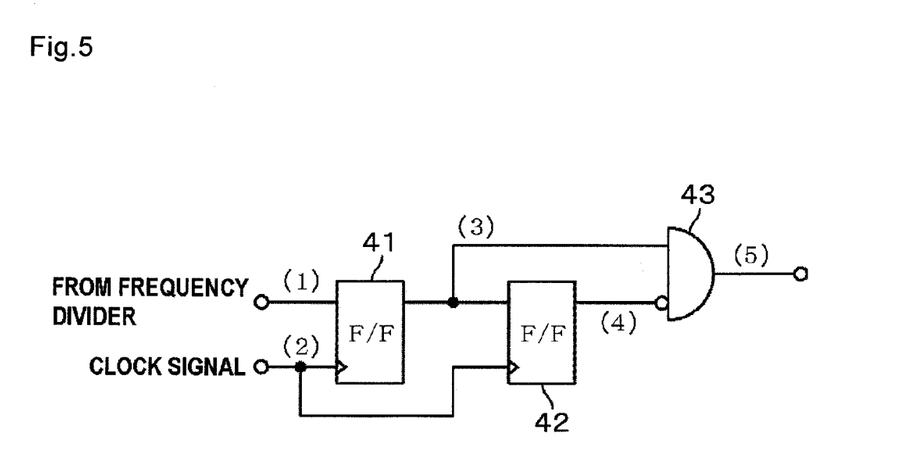
FIG. 5 is a block diagram showing a rising edge detecting circuit used in the embodiment.
Figure 6:
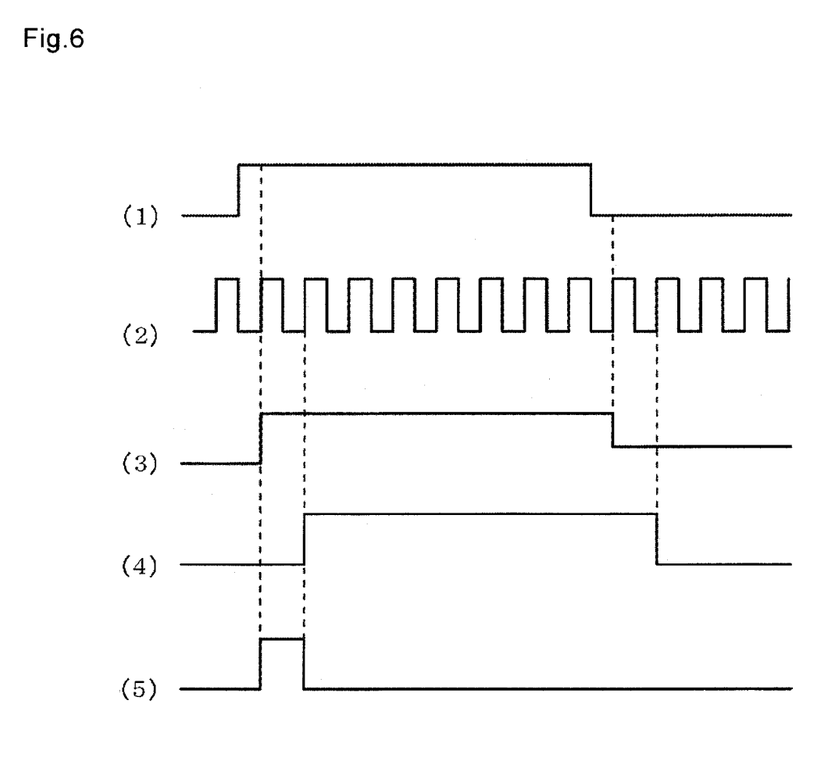
FIG. 6 is a time chart showing the operation of the rising edge detecting circuit.

Returning to FIG. 1, 2 denotes a voltage-controlled oscillator (VCO), which outputs a frequency signal made up of a rectangular wave. In a route to which the output of the voltage-controlled oscillator 2 is fed back, a frequency divider 3 frequency-dividing the frequency signal is provided, and on a subsequent stage of the frequency divider 3, a rising edge detecting circuit 4 detecting a rising edge of the frequency signal (rectangular-wave signal) having undergone the frequency division is provided. As shown in FIG. 5, the rising edge detecting circuit 4 includes: a first flip-flop 41 to which a clock signal from a not-shown clock source and the rectangular-wave signal from the frequency divider 3 are input; a second flip-flop 42 to which an output signal of the first flip-flop 41 and the clock signal are input; and a NAND circuit 43 to which outputs of the both flip-flops 41, 42 are input. FIG. 6 shows signal waveforms of the respective parts in the circuit shown in FIG. 5. Reference signs in the time chart in FIG. 6 correspond to reference signs of the respective parts in FIG. 5.

As is seen from FIG. 6, upon the detection of the rising edge of the rectangular-wave signal from the frequency divider 3, a rectangular-wave signal (see (5) in FIG. 6) is obtained. In this example, the rising edge of the rectangular-wave signal from the frequency divider 3 is detected, but a falling edge of the rectangular-wave signal from the frequency divider 3 may be detected. In short, it is only necessary that the rectangular-wave signal synchronous with the rectangular-wave signal from the frequency divider 3 can be obtained. Therefore, the rising edge detecting circuit 4 corresponds to an example of an edge detecting unit.

Returning to FIG. 1, 5 denotes a latched circuit, which latches a value (digital value) of the saw-tooth wave, which is made up of digital data, obtained in the integrated waveform generating circuit 1, in response to the rectangular wave output from the rising edge detecting circuit 4. 6 denotes a moving average processing circuit, which performs processing of integrating the value of the saw-tooth wave output from the latched circuit 5 a preset number of times and dividing the integrated value by the same number of times. 7 denotes a loop filter, which has a function of integrating an average value output from the moving average processing circuit 6 to adjust a gain of PLL. 8 denotes a D/A converting unit, which D/A converts an output of the loop filter 7 to supply the resultant as a control voltage to the voltage-controlled oscillator 2.

Next, the operation of the above-described embodiment will be described. First, the frequency data is set according to a target frequency that is to be output from the frequency synthesizer being the embodiment. A schematic example of a relation between frequency setting data and the frequency of the saw-tooth wave will be described. For example, assuming that the frequency of the clock signal output from the not-shown clock generator is, for example, 16 MHz, when the frequency setting data is "1", the frequency of the saw-tooth wave is 1 MHz (see FIG. 3), and when the frequency setting data is "2", the frequency of the saw-tooth wave is 2 MHz, in the aforesaid example of the generation of the saw-tooth wave.

Here, the operation of the PLL shown in FIG. 1 will be described with reference to FIG. 7. The frequency divider 3 frequency-divides the output of the voltage-controlled oscillator 2, the rising edge detecting circuit 4 detects the rising edge of the frequency-divided output (the frequency signal with the rectangular wave) shown in (a) in FIG. 7 and outputs the rectangular-wave signal as shown in (b) in FIG. 7. The latched circuit 5 latches the digital value of the saw-tooth wave in response to the rectangular-wave signal (see (c) in FIG. 7) and outputs the latched digital value to the moving average processing circuit 6 (see (d) in FIG. 7). Then, the moving average processing unit 6 calculates a moving average value of the preset numbers of latched digital values, and the loop filter 7 integrates the moving average value to output the resultant as the control voltage to the voltage-controlled oscillator 2.

Figure 7:
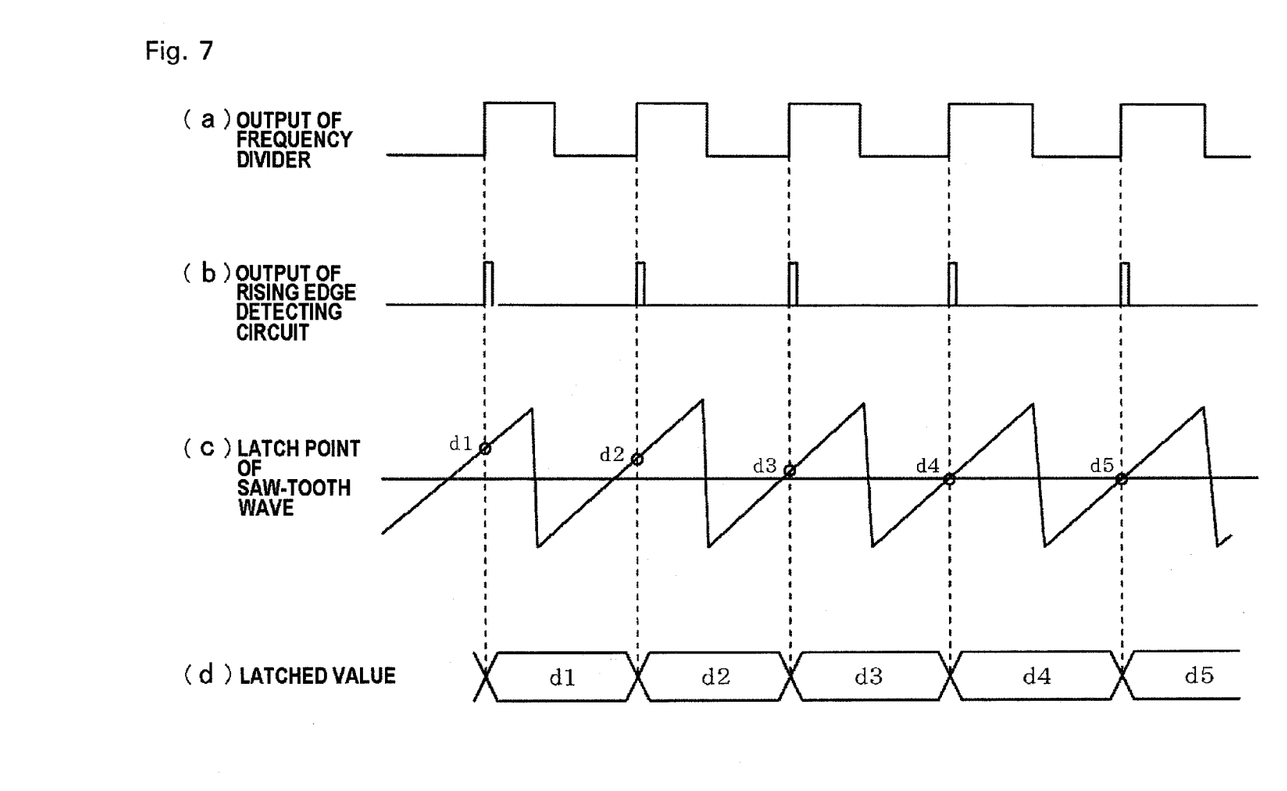
FIG. 7 is a time chart showing the operation of the embodiment.

Here, assuming that, for example, an operation state of the PLL gets out of a locked state and an output frequency of the voltage-controlled is oscillator 2 becomes lower than the frequency of the saw-tooth wave being the phase signal, since a latch point becomes ahead of a zero cross point of the saw-tooth wave as shown in (c) in FIG. 7, the digital value of the saw-tooth wave latched by the latched circuit 5 becomes a positive value. Accordingly, the output of the loop filter 7 becomes high, which in turn makes the output frequency of the voltage-controlled oscillator 2 high, so that the latch point approaches the zero cross point and in due time, the operation state of the PLL becomes the locked state.

On the other hand, assuming that the output frequency of the voltage-controlled oscillator 2 becomes higher than the frequency of the saw-tooth wave being the phase signal, since the latch point is delayed than the zero cross point of the saw-tooth wave, the latched value becomes a negative value. Accordingly, the output of the loop filter 7 becomes low, which accordingly makes the output frequency of the voltage-controlled oscillator 2 low, so that the latch point approaches the zero cross point, and in due time, the operation state of the PLL becomes the locked state.

According to the above-described embodiment, in the frequency synthesizer including the PLL using the processing of digital signals, the value of the saw-tooth wave being the phase signal generated from the digital signal is latched in response to the rectangular-wave signal resulting from the frequency division of the output from the voltage-controlled oscillator, and the control voltage of the voltage-controlled oscillator is generated based on the latched value. This structure requires neither an A/D converting unit nor a large-capacity data table and accordingly can be simple.

According to the embodiment described above, the digital value handled at the integrated waveform generating circuit 1 is "twos" complement, however, as the digital value, it is not limited to "twos" complement. Therefore, the digital values configuring the saw-tooth wave may be a combination of positive values only or negative values only.

In the present invention, the latched value of the saw-tooth wave is not necessarily subjected to the moving average processing. However, since the saw-tooth wave being the phase signal and the rectangular-wave signal being a latch timing signal are asynchronous, there is a concern about the occurrence of a spurious component depending on the set frequency. Therefore, the moving average processing of the latched value of the saw-tooth wave has an advantage of being capable of preventing the occurrence of the spurious component, depending on the set frequency.

What is claimed is:

1. A frequency synthesizer comprising: a voltage-controlled oscillator; a frequency divider which divides a frequency signal output from the voltage controlled oscillator; an integrated waveform generating unit receiving a digital signal having a digital value that depends on a set frequency and integrating the digital value to generate a saw-tooth wave having a saw-tooth shaped integrated waveform in which a negative value and a positive value are combined; an edge detecting unit detecting a rising edge or a falling edge of a frequency signal output from the frequency divider to output a rectangular wave signal that depends on a frequency of the frequency signal; a latched circuit latching a value of the saw-tooth wave generated by the integrated waveform generating unit, in response to the rectangular wave signal; a loop filter integrating the value of the saw-tooth wave latched by the latched circuit; and a digital/analog converting unit digital/analog-converting an output of the loop filter to output a resultant to the voltage-controlled oscillator.

2. The frequency synthesizer according to claim 1, characterized that the digital value to be integrated at the integrated waveform generating unit is twos complement.

3. The frequency synthesizer according to claim 1, further comprising a moving average processing circuit performing moving average processing of the value of the saw-tooth wave output from the latched circuit to output a resultant to the loop filter.

* * * * *